US012686613B2

(12) United States Patent (10) Patent No.: US 12,686,613 B2
Jenkins et al. (45) Date of Patent: Jul. 21, 2026

(54) MEMS DEVICE

(71) Applicant: AAC Technologies Pte. Ltd., Singapore (SG)

(72) Inventors: Colin Robert Jenkins, Edinburgh (GB); Scott Lyall Cargill, Edinburgh (GB); Euan James Boyd, Edinburgh (GB)

(73) Assignee: AAC Technologies Pte. Ltd., Singapore (SG)

( * ) Notice: Subject to any disclaimer, the term of this patent is extended or adjusted under 35 U.S.C. 154(b) by 450 days.

(21) Appl. No.: 18/325,018

(22) Filed: May 29, 2023

(65) Prior Publication Data

US 2024/0400376 A1 Dec. 5, 2024

(51) Int. Cl.
*B81B 3/00* (2006.01)

(52) U.S. Cl.
CPC .... *B81B 3/0078* (2013.01); *B81B 2201/0257* (2013.01); *B81B 2203/0127* (2013.01); *B81B 2203/0315* (2013.01); *B81B 2203/0353* (2013.01); *B81B 2203/04* (2013.01)

(58) Field of Classification Search
CPC ... B81B 3/0078; B81B 3/0035; B81B 3/0064; B81B 2203/0127; B81B 2203/04
See application file for complete search history.

(56) References Cited

U.S. PATENT DOCUMENTS

| | | | | |
|---|---|---|---|---|
| 2016/0066099 A1* | 3/2016 | Dehe | ......................... | H04R 7/08 |
| | | | | 381/174 |
| 2018/0234774 A1* | 8/2018 | Walther | ............... | H04R 19/005 |
| 2019/0071305 A1* | 3/2019 | Strasser | ................... | B81B 7/02 |
| 2019/0098418 A1* | 3/2019 | Hermes | .................. | H04R 19/04 |

FOREIGN PATENT DOCUMENTS

CN 114222213 A * 3/2022 ............... H04R 1/02

* cited by examiner

*Primary Examiner* — Mariceli Santiago
(74) *Attorney, Agent, or Firm* — Wiersch Law Group

(57) ABSTRACT

An MEMS device, including: a substrate having a back cavity; a diaphragm connected to the substrate and covers the back cavity, the diaphragm includes first and second membranes arranged oppositely, and accommodation space is formed therebetween; a counter electrode in the accommodation space and includes annular beams and first spokes, the annular beams are successively arranged at intervals, and the first spokes extend radially outward from an axis of the counter electrode, an end of the first spokes is connected to the substrate, and two adjacent first spokes and two adjacent annular beams jointly form a first through hole; and a support arranged corresponding to the first through hole, and opposite ends of the support are respectively connected to the first and second membranes. This configuration is more sensitive to sound pressure and is conducive to realizing low-noise microphone while optimizing sensitivity.

9 Claims, 3 Drawing Sheets

MEMS DEVICE

TECHNICAL FIELD

The present disclosure relates to the technical field of micro-electro-mechanical systems, in particular to an MEMS device.

BACKGROUND

In the related art, a microphone with a dual-membrane structure has been developed and produced, this kind of microphone has two membranes on opposite sides of a counter electrode. Such a configuration creates a sealed accommodation space between the two membranes, which can have different pressures with respect to the external environment, and thus affects the sensitivity of the microphone, which is very important for realizing a low-noise microphone.

SUMMARY

In view of the above problems, the present disclosure provides an MEMS device to solve the technical problems in the related art, which can optimize the sensitivity and realize a structure more sensitive to sound pressure.

In a first aspect, the present disclosure provides an MEMS device, including: a substrate having a back cavity passing through the substrate; a diaphragm connected to the substrate and covers the back cavity, the diaphragm includes a first membrane and a second membrane arranged opposite to each other, and an accommodation space is formed between the first membrane and the second membrane; a counter electrode arranged in the accommodation space and including annular beams and first spoke, the annular beams are successively arranged at intervals with an axis of the counter electrode as a center line, and the first spokes extend radially outward with the axis of the counter electrode as a starting point, an end of the first spokes is connected to the substrate, and two adjacent first spokes and two adjacent annular beams jointly form a first through hole; and a support arranged corresponding to the first through hole, and opposite ends of the support are respectively connected to the first membrane and the second membrane.

As an improvement, the counter electrode further includes second spokes extending along a radial direction of the diaphragm, and the second spoke are arranged between adjacent first spokes, a starting point of the second spoke is connected to one of the annular beams, and an end of the second spoke is connected to the substrate, and the first spoke, the second spoke and two adjacent annular beams jointly form a second through hole.

As an improvement, both the first through hole and the second through hole are arc holes.

As an improvement, the counter electrode is provided with third through holes, and the third through holes are distributed in the annular beams, the first spokes and the second spokes.

As an improvement, each of the third through holes has a circular shape, a hexagonal shape or other regular shapes.

As an improvement, cross-sections of the first spoke and the second spoke are tapered or rectangular.

As an improvement, the annular beams are successively arranged at equal intervals with the axis of the counter electrode as the center line.

As an improvement, the first spokes are arranged at equal intervals with the axis of the counter electrode as the center line.

As an improvement, the counter electrode further includes an insulating film and an electrode region stacked on the insulating film.

As an improvement, the counter electrode is formed by doping conductive ions in a semiconductor material.

Compared with the related art, the counter electrode of the present disclosure is composed of annular beams and first spokes to form a spider-web like structure, which is more sensitive to sound pressure, and thus is conducive to the realization of a low-noise microphone, while optimizing the sensitivity and preventing change of the sensitivity under different pressure

REFERENCE SIGNS

Figure 1:
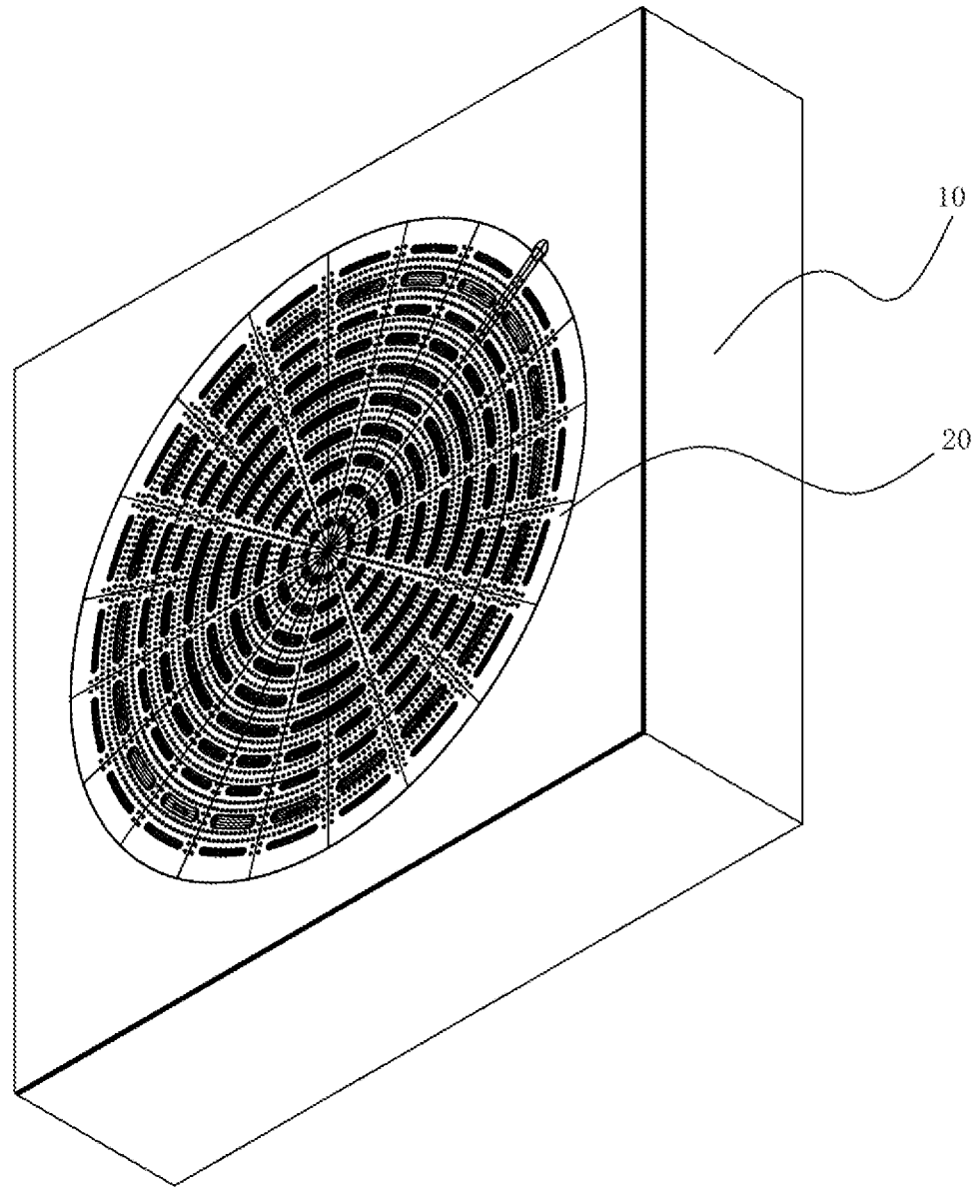
FIG. 1 is a perspective view of an MEMS device according to an embodiment of the present disclosure.
Figure 2:
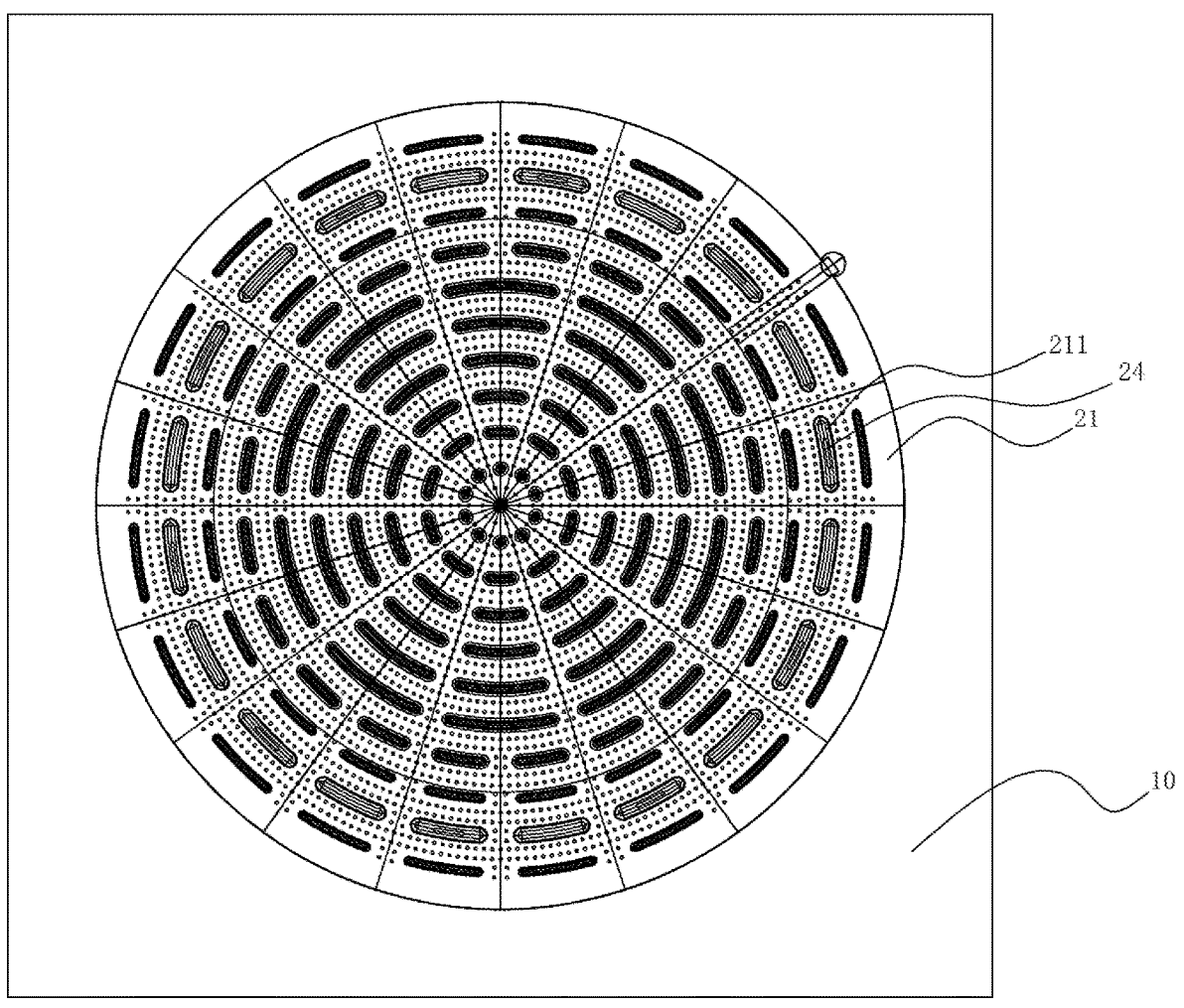
FIG. 2 is a top view of an MEMS device according to an embodiment of the present disclosure.

10—substrate, 11—back cavity;
20—diaphragm, 21—first membrane, 211—first protrusion, 22—second membrane, 221—second protrusion, 23—accommodation space, 24—ventilation slot;
30—counter electrode, 31—annular beam, 32—first spoke, 33—second spoke, 34—first through hole, 35—second through hole, 36—third through hole;
40—support.

DESCRIPTION OF EMBODIMENTS

Embodiments described below with reference to the figures are exemplary only for explaining the present disclosure and shall not be construed as limiting the present disclosure.

As shown in FIGS. 1-4, the present disclosure provides an MEMS device, including a substrate 10, a diaphragm 20, a counter electrode 30 and a support 40. A back cavity 11 passes through the substrate 10. Optionally, an inner contour surface of the back cavity 11 is a circular slot structure.

The diaphragm 20 is connected to the substrate 10 and covers the back cavity 11. The diaphragm 20 includes a first membrane 21 and a second membrane 22 arranged opposite to each other. In this embodiment, the first membrane 21 and the second membrane 22 are both concentrically arranged circular structures, and a preset gap is kept between the first membrane 21 and the second membrane 22 to form an accommodation space 23. The first membrane 21 is located above as shown in FIG. 1, and the second membrane 22 is located below the first membrane 21.

The counter electrode 30 is suspended in the accommodation space 23. In a normal state, there is no contact between the counter electrode 30 and the first membrane 21 and the second membrane 22. A first capacitance is formed between the first membrane 21 and the counter electrode 30, and a second capacitance is formed between the second membrane 22 and the counter electrode 30. In response to the pressure applied on the first membrane 21 and the second membrane 22, the first membrane 21 and the second membrane 22 are movable relative to the counter electrode 30, thereby changing the distance between the first membrane 21 and the diaphragm 22 with respect to the counter electrode 30, which results in a change in capacitance and thus a corresponding output of an electrical signal.

Figure 4:
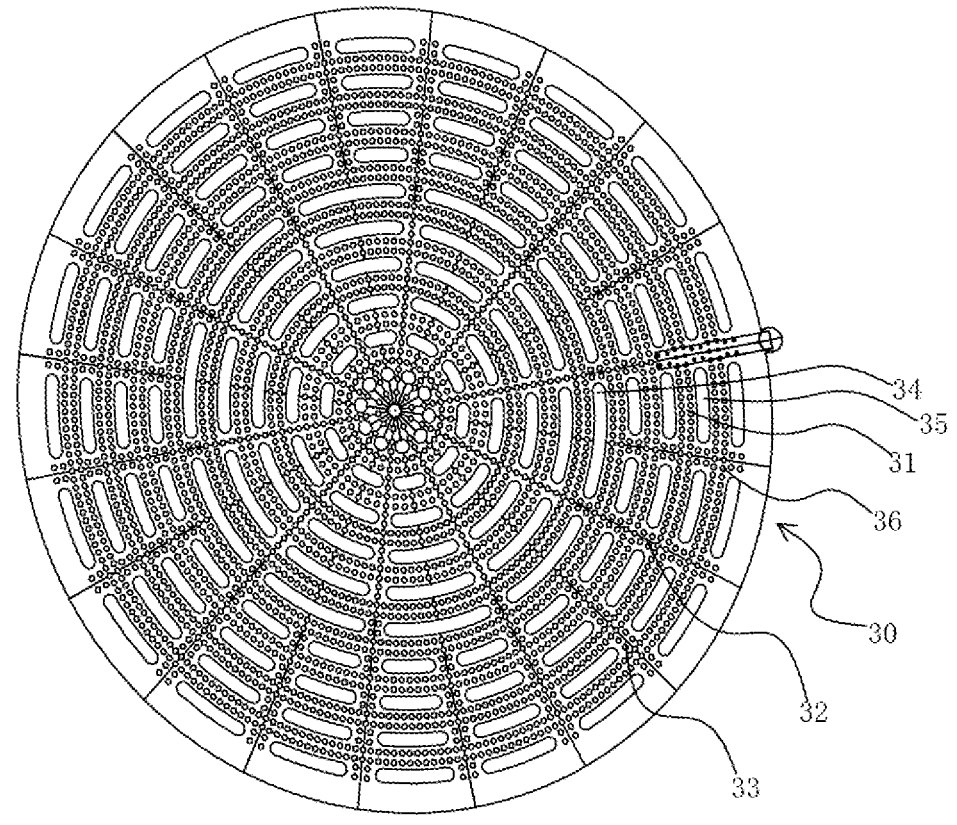
FIG. 4 is a perspective view of a counter electrode according to an embodiment of the present disclosure.

According to the present disclosure, the axis of the counter electrode 30 coincides with the axis of the diaphragm 20. As shown in FIG. 4, the counter electrode 30 includes annular beams 31 and first spokes 32. The annular beams are arranged at intervals with respect to the axis of the counter electrode 30 as the center line. The centers of the annular beams 31 are all located on the axis of the counter electrode 30. The farther away from the axis of the counter electrode 30, the larger the radius of the annular beam 31 is. The first spokes 32 take the axis of the counter electrode 30 as the starting point and extend radially outward, the intersection point of adjacent first spokes 32 is located on the axis of the counter electrode 30, and the first spokes 32 extend along the radial direction of the diaphragm 20. Along the extending direction, the first spokes 32 are connected to the annular beams 31, so as to connect the annular beams 31 to form an integral structure. The ends of the first spokes 32 are connected to the substrate 10, two adjacent first spokes 32 and two adjacent annular beams 31 jointly form a first through hole 34.

The support 40 is disposed corresponding to the first through hole 34, and opposite ends of the support 40 are respectively connected to the first membrane and the second membrane. The function of the support 40 is to keep the first membrane 21 and the second membrane 22 flat, or at least limit/constrain the bending/deformation of the first membrane 21 and the second membrane 22 between the support 40 to avoid the first membrane 21 and the second membrane 22 from being folded over each other when the air pressure in the accommodation space 23 is below ambient atmospheric pressure and the outside is at ambient atmospheric pressure.

In the above embodiment, the counter electrode 30 is composed of annular beams 31 and first spokes 32 to form a spider-web like structure, which is more sensitive to sound pressure, which is conducive to the realization of a low-noise microphone, while optimizing the sensitivity and preventing change of the sensitivity under different pressure.

As shown in FIG. 4, the counter electrode 30 further includes second spokes 33 extending along the radial direction of the diaphragm 20, and the second spokes 33 are arranged between adjacent first spokes 32. The starting point of the second spoke 33 is connected to one of the annular beams 31, and the end of the second spoke 33 is connected to the substrate 10. The length of the second spoke 33 is relatively short, and only connects the two outermost annular beams 31. The first spoke 32, the second spoke 33 and the two adjacent annular beams 31 jointly form a second through hole 35. The second through hole 35 is provided with a support 40, opposite ends of support 40 are respectively connected to the first membrane 21 and the second membrane 22.

In an embodiment, the first through hole 34 and the second through hole 35 are arc holes, so that the volume of the support 40 can be increased, and larger support 40 can be used to support the first membrane 21 and the second membrane 22, to provide larger distance between the adjacent arc holes, which solves the technical problem that a large number of via holes need to be provided in the counter electrode 30. In the present disclosure, the design of the counter electrode 30 and the design of the support 40 are separated, and the support 40 is much larger than the small columns of the related art, this allows a much taller column structure for the same aspect ratio, which allows the use of a thicker counter electrode 30, a stiffer structure, thereby significantly improving the stability and reliability of the device.

The counter electrode 30 is provided with third through holes 36, and the third through holes 36 are distributed on the annular beams 31, the first spokes 32 and the second spokes 33, thereby increasing compliance of the counter electrode 30 and, at the same time, reduce the inter-plate capacitance between the first membrane 21 and the second membrane 22, thereby improving the sensitivity of the MEMS device. Further, the third through hole 36 has a circular shape, a hexagonal shape or other regular shapes. Those skilled in the art can understand that the third through holes 36 may also be other types of holes, such as square holes, polygonal holes and other shapes of holes, which are not limited here.

According to the present disclosure, the cross section of the first spoke 32 and the second spoke 33 is tapered or rectangular, when the cross section of the first spoke 32 and the second spoke 33 is tapered, the narrow side of the tapered structure is closer to the axis of the counter electrode 30 than the wide side, and the farther away from the axis of the counter electrode 30, the wider the first spoke 32 and the second spoke 33. The deflection of the first spoke 32 and the deflection of the second spoke 33 are parabolic, which present maximum at the axis of the counter electrode 30, and drops to zero at the edge. When the cross-section of the first spoke 32 and the second spoke 33 is rectangular, along the radial direction of the counter electrode 30, the widths of the first spokes 32 and the second spokes 33 are the same.

As shown in FIG. 4, the annular beams 31 are arranged at equal intervals successively with the axis of the counter electrode 30 as the center line, and along the radial direction of the counter electrode 30, the spacing between adjacent annular beams 31 is the same, and the widths of adjacent annular beams 31 are also the same. Those skilled in the art will understand that, along the radial direction of the counter electrode 30, the spacing between adjacent annular beams 31 can also be set differently, which can be proportionally increasing or decreasing, the width of adjacent annular beams 31 can also be set as proportionally increasing or decreasing.

Referring to FIG. 4, the first spokes 32 are arranged at equal intervals with the axis of the counter electrode 30 as the center line, and along the radial direction of the counter electrode 30, the included angle between adjacent first spokes 32 is the same, and the widths of adjacent first spokes 32 are also the same. Those skilled in the art will understand that along the radial direction of the counter electrode 30, the included angles between adjacent first spokes 32 can also be set differently, and can be proportionally increasing or decreasing, the width of the spokes 32 can also be set as proportionally increasing or decreasing.

According to the present disclosure, the counter electrode 30 includes an insulating film and an electrode area stacked on the insulating film, the electrode area is a conductive portion, the insulating film is a non-conductive portion, or the entire counter electrode 30 is the conductive portion, the counter electrode 30 is formed by doping conductive ions in the semiconductor material.

Figure 3:
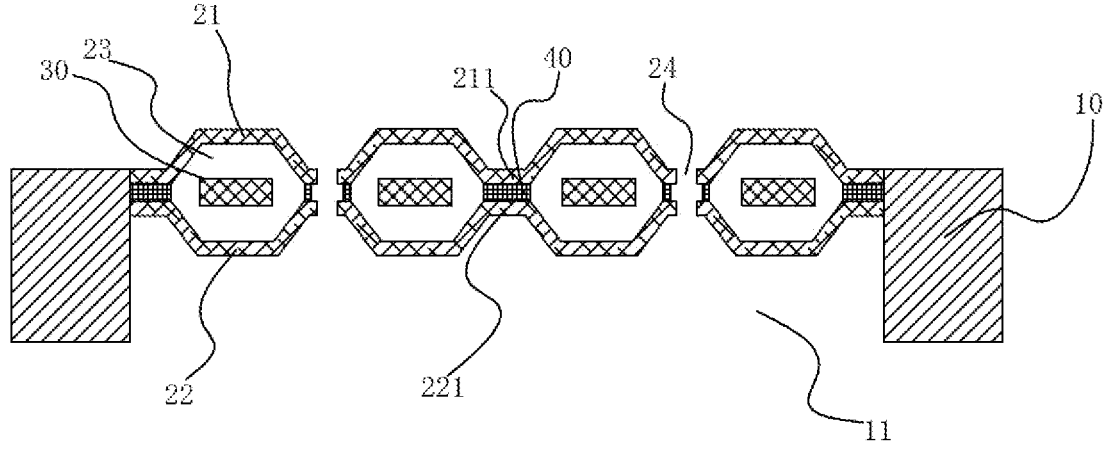
FIG. 3 is a structural schematic diagram of an MEMS device according to an embodiment of the present disclosure.

In this embodiment, as shown in FIG. 3, both the first membrane 21 and the second membrane 22 are provided with ventilation slots 24. Optionally, the ventilation slots 24 run through the first membrane 21, the support 40 and the second membrane 22, which is equivalent to creating a ventilation opening that penetrates the first membrane 21 and the second membrane 22, thereby significantly increasing the compliance of the membrane in the area where the ventilation slot 24 is located. The ventilation slots 24 on the first membrane 21 and the second membrane 22 may have the same size and shape, or may be different, which are not limited here.

In this embodiment, as shown in FIG. 3, the diaphragm 20 has a corrugated structure. The first membrane 21 includes first protrusions 211 protruding toward the accommodation space 23, and the second membrane 22 includes second protrusion 221 protruding towards the accommodation space 23. The support 40 is connected to the first protrusion 211 and the second protrusion 221, and the first membrane 21 and the second membrane 22 are close to each other at the support 40, where the capacitance is highest.

Optionally, the shape and size of the first protrusion 211 and the second protrusion 221 are the same, so as to form regular corrugations, so that the stress distribution on the entire diaphragm 20 is uniform and, at the same time, convenient for manufacturing. The cross-sectional shape of the first protrusion 211 and the second protrusion 221 in the direction perpendicular to the diaphragm 20 can be rectangular, trapezoidal or triangular, etc., and the angle of the inclined surface of the first protrusion 211 and the second protrusion 221 is greater than 0°, less than or equal to 90°. Those skilled in the art can understand that the cross-sectional shape of the first protrusion 211 and the second protrusion 221 in the direction perpendicular to the diaphragm 20 can be a regular pattern or an irregular pattern, which is not limited here.

The first protrusion 211 and the second protrusion 221 together form the corrugation of the diaphragm 20, so that the diaphragm 20 can have greater tension and can withstand greater sound pressure to obtain smaller internal stress, the stiffness of the diaphragm 20 is reduced, and the mechanical sensitivity of the MEMS device is effectively improved.

The structure, features and effects of the present disclosure have been described in detail above based on the embodiments shown in the drawings. The above are only preferred embodiments of the present disclosure, but the present disclosure does not limit the scope of embodiments as shown in the drawings. Changes or modifications made according to the concept of the present disclosure shall be within the scope of protection of the present disclosure.

What is claimed is:

1. A micro-electromechanical system (MEMS) device, comprising:

a substrate having a back cavity passing through the substrate;

a diaphragm connected to the substrate and covers the back cavity, wherein the diaphragm comprises a first membrane and a second membrane arranged opposite to each other, and an accommodation space is formed between the first membrane and the second membrane;

a counter electrode arranged in the accommodation space and comprising annular beams and first spokes, wherein the annular beams are successively arranged at intervals with an axis of the counter electrode as a center line, and the first spokes extend radially outward with the axis of the counter electrode as a starting point, an end of the first spokes is connected to the substrate, and two adjacent first spokes and two adjacent annular beams jointly form a first through hole; and a support arranged corresponding to the first through hole, and opposite ends of the support are respectively connected to the first membrane and the second membrane;

the counter electrode further comprising second spokes extending along a radial direction of the diaphragm, and the second spokes arranged between adjacent first spokes, a starting point of the second spoke connected to one of the annular beams, and an end of the second spoke connected to the substrate, and the first spoke, the second spoke and two adjacent annular beams jointly forming a second through hole.

2. The MEMS device according to claim 1, wherein the first through hole and the second through hole are arc holes.

3. The MEMS device according to claim 1, wherein the counter electrode is provided with third through holes, and the third through holes are distributed in the annular beams, the first spokes and the second spokes.

4. The MEMS device according to claim 3, wherein each of the third through holes has a circular shape, a hexagonal shape or other regular shapes.

5. The MEMS device according to claim 1, wherein cross sections of the first spoke and the second spoke are tapered or rectangular.

6. The MEMS device according to claim 1, wherein the annular beams are successively arranged at equal intervals with the axis of the counter electrode as the center line.

7. The MEMS device according to claim 1, wherein the first spokes are arranged at equal intervals with the axis of the counter electrode as the center line.

8. The MEMS device according to claim 1, wherein the counter electrode further comprises an insulating film and an electrode region stacked on the insulating film.

9. The MEMS device according to claim 1, wherein the counter electrode is formed by doping conductive ions in a semiconductor material.

* * * * *